United States Patent
Hassner et al.

(10) Patent No.: US 7,743,311 B2
(45) Date of Patent: Jun. 22, 2010

(54) COMBINED ENCODER/SYNDROME GENERATOR WITH REDUCED DELAY

(75) Inventors: Martin Hassner, Mountain View, CA (US); Kirk Hwang, Palo Alto, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 1005 days.

(21) Appl. No.: 11/341,230

(22) Filed: Jan. 26, 2006

(65) Prior Publication Data

US 2007/0192669 A1 Aug. 16, 2007

(51) Int. Cl.
H03M 13/00 (2006.01)
(52) U.S. Cl. .................................................. 714/785
(58) Field of Classification Search .................. 714/785
See application file for complete search history.

(56) References Cited

U.S. PATENT DOCUMENTS

| | | | | |
|---|---|---|---|---|
| 3,629,824 A * | 12/1971 | Bossen | ...................... | 714/755 |
| 3,652,986 A * | 3/1972 | Monroe | ...................... | 714/789 |
| 4,201,976 A * | 5/1980 | Patel | .......................... | 714/804 |
| 4,205,324 A * | 5/1980 | Patel | .......................... | 714/804 |
| 4,388,684 A * | 6/1983 | Nibby et al. | .................. | 714/52 |
| 4,414,666 A * | 11/1983 | Nelson | ........................ | 714/785 |
| 4,736,376 A * | 4/1988 | Stiffler | ........................ | 714/785 |
| 4,747,103 A * | 5/1988 | Iwamura et al. | ............. | 714/755 |
| 4,763,330 A * | 8/1988 | Shimizu | ...................... | 714/785 |
| 4,777,635 A * | 10/1988 | Glover | ......................... | 714/756 |
| 5,107,503 A * | 4/1992 | Riggle et al. | ................. | 714/784 |
| 5,241,546 A * | 8/1993 | Peterson et al. | ............. | 714/761 |
| 5,384,786 A * | 1/1995 | Dudley et al. | ................ | 714/784 |
| 5,444,719 A | 8/1995 | Cox et al. | | |
| 5,504,758 A * | 4/1996 | Inoue et al. | .................. | 714/775 |
| 5,555,516 A * | 9/1996 | Zook | .......................... | 708/492 |
| 5,592,404 A * | 1/1997 | Zook | .......................... | 708/492 |
| 5,805,617 A * | 9/1998 | Im | .............................. | 714/785 |
| 5,974,580 A * | 10/1999 | Zook et al. | ................... | 714/755 |
| 5,991,911 A * | 11/1999 | Zook | .......................... | 714/758 |
| 5,996,105 A * | 11/1999 | Zook | .......................... | 714/755 |
| 6,115,837 A * | 9/2000 | Nguyen et al. | .............. | 714/769 |
| 6,163,871 A | 12/2000 | Yang | | |
| 6,332,206 B1 * | 12/2001 | Nakatsuji et al. | ............ | 714/755 |
| 6,360,349 B1 * | 3/2002 | Kawanishi | ................... | 714/785 |
| 6,493,845 B1 | 12/2002 | Shen et al. | | |
| 6,871,315 B2 * | 3/2005 | Seki | ............................ | 714/782 |

* cited by examiner

Primary Examiner—Joseph D Torres
(74) Attorney, Agent, or Firm—Steven J. Cahill

(57) ABSTRACT

A combined encoder/syndrome generator is provided that has a reduced delay. The combined encoder/syndrome generator generates check symbols during an encoding process and error syndromes during a decoding process. The combined encoder/syndrome generator has two or more blocks. The output of each block is fed as an input into a subsequent block. Each block can perform computations in parallel to reduce the delay of the encoding system.

8 Claims, 10 Drawing Sheets n-Stage Parallel Configuration

Type-I Topology

Type-II Topology

1-Stage Parallel Configuration

2-Stage Parallel Configuration

8-Partial Check Look-Ahead Circuit

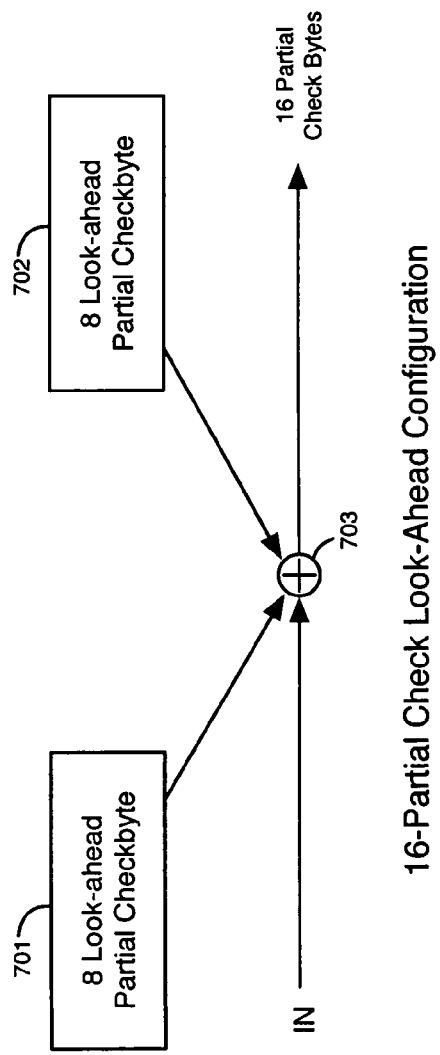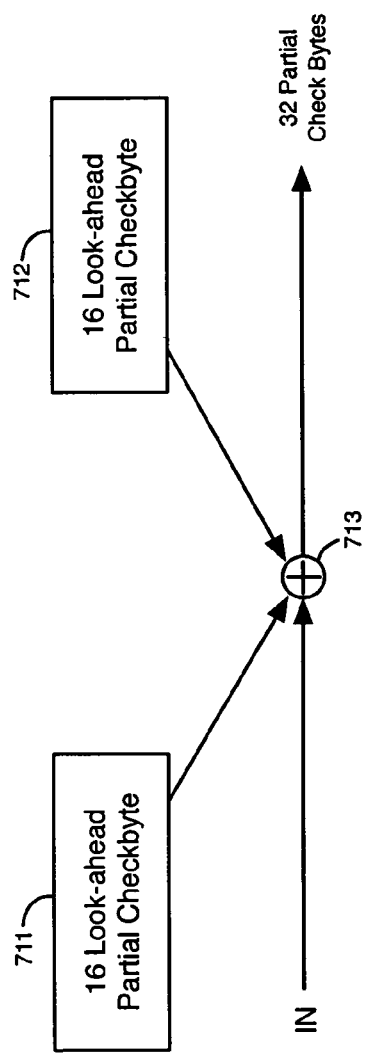

Hybrid 8/16-Partial Check Look-Ahead Configuration

COMBINED ENCODER/SYNDROME GENERATOR WITH REDUCED DELAY

BACKGROUND OF THE INVENTION

1. Field of the Invention

The present invention relates to error correction systems, and more particularly, to error correction systems that use a combined encoder/syndrome generator to generate both check symbols and error syndromes.

2. Description of the Related Art

A combined encoder/syndrome generator is an error correction circuit that can generate both check symbols and error syndromes. The combined error/syndrome generator generates check symbols during an encoding process. The check symbols are appended to a bit stream.

The combined encoder/syndrome generator generates error syndromes during a decoding process. The error syndromes are transmitted to a decoder, which uses the error syndromes to compute error locations and error values. The error locations and error values are used to correct errors in the bit stream. A controller selects between the encoding and decoding operations of the combined encoder/syndrome generating circuit using a control signal.

A combined encoder/syndrome generator circuit has multiple stages that are coupled together in series. Each stage of the combined encoder/syndrome generator circuit typically includes one multiplier and one or two adders. One input for each stage of the circuit (except the first stage) is an output from the previous stage. As a result, the delay of the combined encoder/syndrome generator circuit increases as the number of stages in the circuit is increased. The delay of a combined encoder/syndrome generator circuit having a large number of stages can be significant.

Therefore, it would be desirable to provide a combined encoder/syndrome generator that has a reduced delay relative to many prior art circuits.

BRIEF SUMMARY OF THE INVENTION

The present invention provides a combined encoder/syndrome generator that has a reduced delay. The combined encoder/syndrome generator generates check symbols during an encoding process and error syndromes during a decoding process. The combined encoder/syndrome generator has two or more blocks. The output of each block is fed as an input into a subsequent block. Each block can perform computations in parallel to reduce the delay of the combined encoder/syndrome generator during the encoding process.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 7A is a block diagram that illustrates how the outputs of two 8-partial check byte look-ahead blocks are combined to generate 16-partial check bytes, according to another embodiment of the present invention.

FIG. 7B is a block diagram that illustrates how the outputs of two 16-partial check byte look-ahead outputs are combined to generate 32-partial check bytes, according to another embodiment of the present invention.

DETAILED DESCRIPTION OF THE INVENTION

Figure 1A:
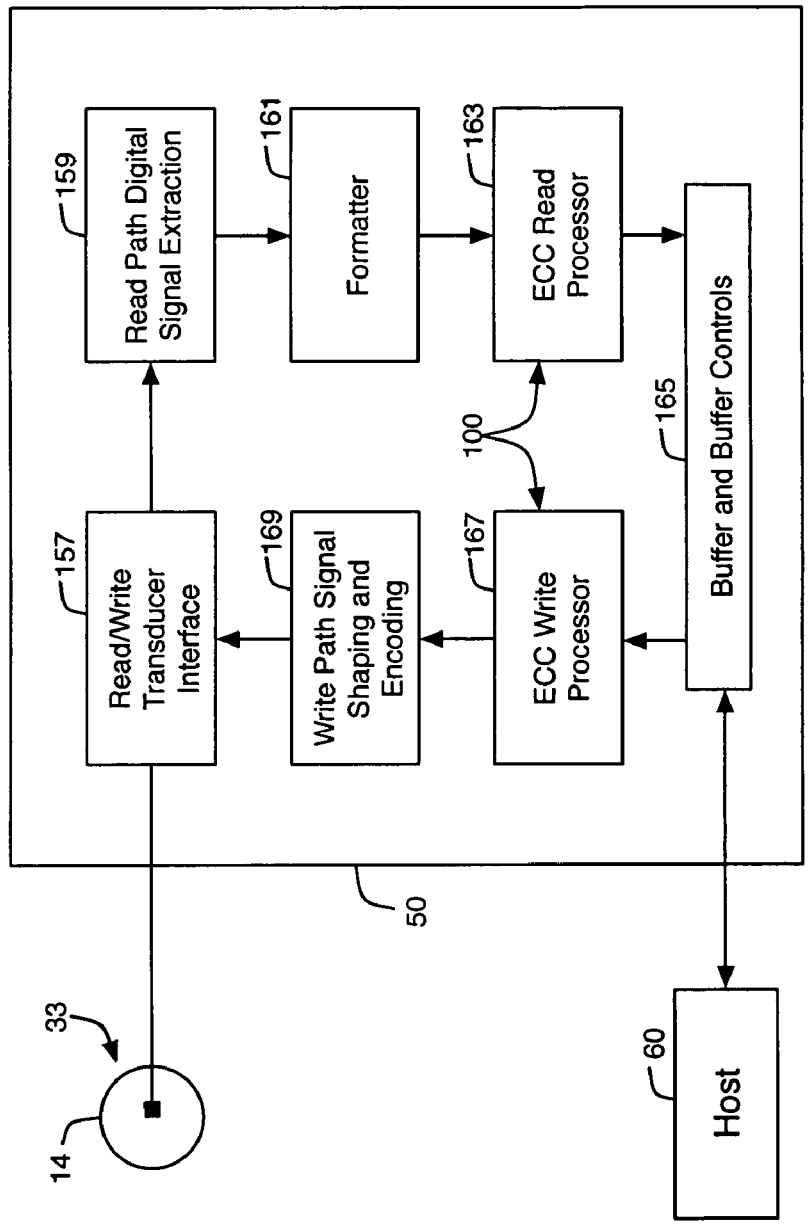
FIG. 1A is a block diagram of a data storage system depicting data flow along a read channel and a write channel of the hard disk drive controller of FIG. 1B.
Figure 1B:
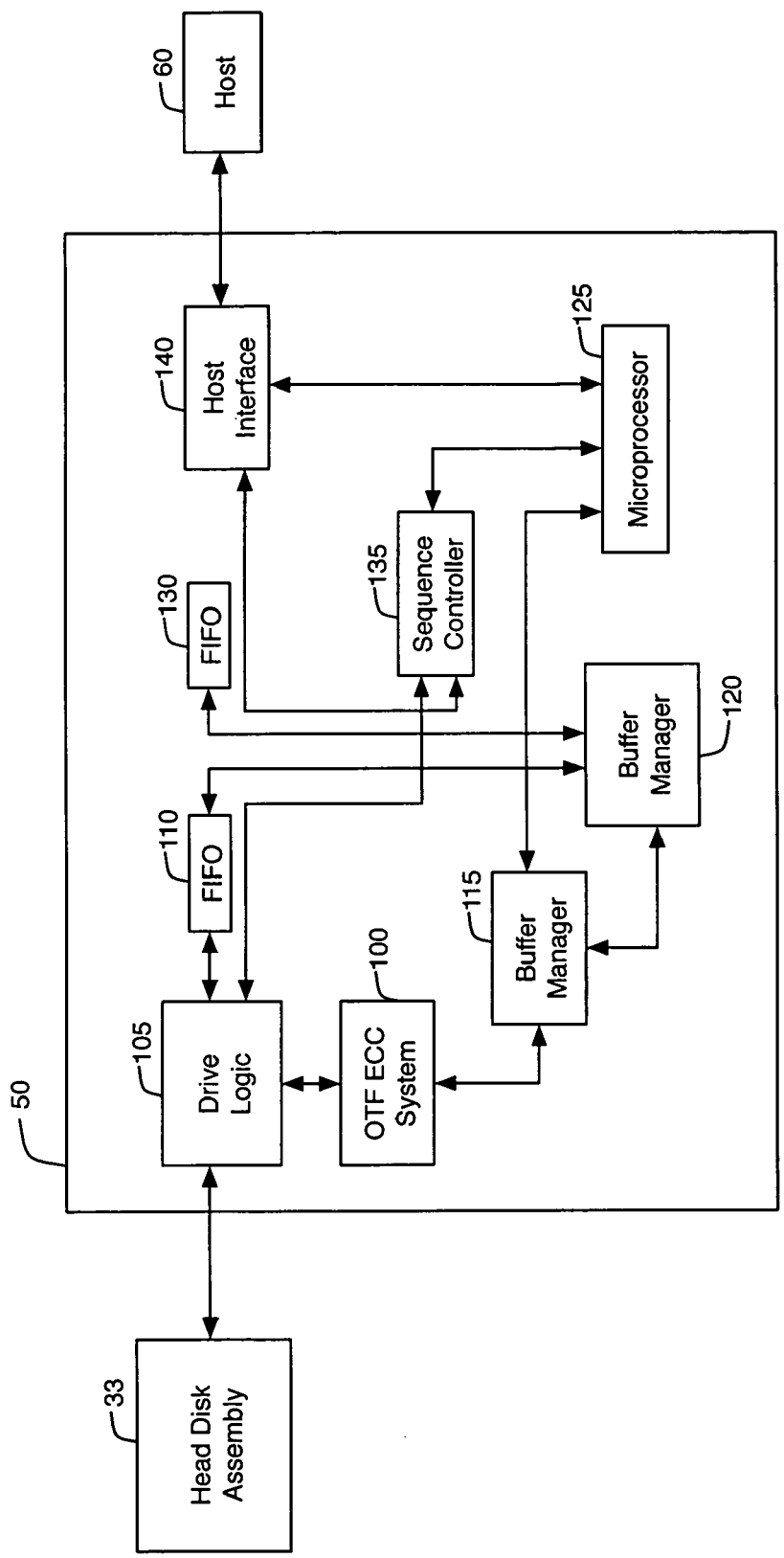
FIG. 1B is a block diagram detailing the architecture of a buffered hard disk drive controller that includes an on-the-fly error correction code (ECC) system for implementing on-the-fly error correction code.

FIGS. 1A and 1B illustrate an example of a hard disk drive control system for reading and writing data onto a magnetic hard disk. FIG. 1A is a block diagram of a data storage system, and FIG. 1B is a block diagram showing the architecture of a hard disk controller. The hard disk drive control system of FIGS. 1A-1B is an example of hard disk drive system that can implement techniques of the present invention. The hard disk drive system of FIGS. 1A-1B can detect and correct errors in the data read from a disk.

FIG. 1B illustrates an exemplary architecture of a buffered hard disk drive controller 50. Hard disk drive controller 50 is configured to read data from and write data to a magnetic hard disk 14 shown in FIG. 1A. Controller 50 includes an on-the-fly error correction code (ECC) system 100 for implementing an on-the-fly error correction code.

On-the-fly error correction code system 100 includes an ECC read processor 163 and an ECC write processor 167 as shown in FIG. 1A. When sequences of digital binary data are to be written onto the disk 14, they are placed temporarily in a buffer 165 shown in FIG. 1A and subsequently processed and transduced along a write path or channel (167, 169, and 157).

The hard disk drive controller 50 includes a logic drive circuit 105 shown in FIG. 1B that formats data from hard disk assembly 33, for example from 8 bits to 32 bits. A disk assembly 33 is comprised of disk 14 and a head stack assembly including a spindle motor. A FIFO register 110 stores the formatted data and exchanges the same with a sector buffer 120. The ECC system 100 receives the formatted data from the drive logic circuit 105 and performs an error correction coding algorithm. ECC system 100 can also perform the techniques and processes of the present invention, which are discussed in detail below.

A buffer manager 115 controls data traffic between the ECC system 100, a sector buffer (i.e., random access memory) 120, and a microprocessor 125. Another FIFO register 130 stores data and exchanges the same with the sector buffer 120. A sequence controller 135 is connected between the drive logic circuit 105, the microprocessor 125, and a host interface 140, to control the sequence operation of the data traffic and various commands across the hard drive controller 50. The host interface 140 provides an interface between the hard drive controller 50 and a host 60.

First, a predetermined number of binary data elements, also termed bytes, in a data string are moved from the buffer 165 and streamed through an ECC write processor 167. In the ECC write processor 167, the data bytes are mapped into codewords drawn from a suitable linear block or cyclic code such as a Reed-Solomon code. Next, each codeword is mapped in a write path signal-shaping unit 169 into a run length limited or other bandpass or spectral-shaping code and changed into a time-varying signal. The time-varying signal is applied through an interface read/write transducer interface 157 and then to the write element in a magneto resistive (or other suitable transducer head) for conversion into magnetic flux patterns.

All of the measures starting from the movement of the binary data elements from buffer 165 until the magnetic flux patterns are written on a selected disk track as the rotating disk 14 passes under the read/write head are synchronous and streamed. For purposes of efficient data transfer, the data is de-staged (written out) or staged (read) a codeword at a time.

Thus, both the mapping of binary data into Reed-Solomon codewords and the conversion to flux producing time-varying signals are done well within the time interval defining a unit of recording track length moving under the transducer. Typical units of recording track length are equal fixed-length byte codewords of 512 bytes.

When sequences of magnetic flux patterns are to be read from the disk 14, they are processed in a read path or channel (157, 159, 161, and 163) and written into the buffer 165. The time-varying signals sensed by a transducer are passed through the read/write transducer interface 157 to a digital signal extraction unit 159. Here, the signal is detected and a decision is made as to whether it should be resolved as a binary 1 or 0. As these 1's and 0's stream out of the signal extraction unit 159, they are arranged into codewords in the formatting unit 161.

Because the read path is evaluating sequences of Reed-Solomon codewords previously recorded on the disk 14, absent error or erasure, the codewords should be the same. In order to test whether that is the case, each codeword is applied to an RS decoder in ECC read processor 163 over a path from formatter 161.

The output from the ECC processor 163 is written into buffer 165. The read path also operates in a synchronous data-streaming manner such that any detected errors are located and corrected within the codeword well in time for the ECC read processor 163 to receive the next codeword read from the disk track. The buffer 165 and the read and write channels may be monitored and controlled by the microprocessor 125 to ensure efficacy where patterns of referencing may dictate that a path not be taken down, such as sequential read referencing.

The present invention provides combined encoder/syndrome generator blocks. A combined encoder/syndrome generator can generate check symbols in an encoding mode and syndromes in a decoding mode. A combined encoder/syndrome generator of the present invention can generate check symbols in a more efficient manner than many prior art systems. The present invention also provides combined encoders/syndrome generators having an adjustable latency that is efficient for encoding a large number of check symbols.

According to the present invention, two or more adder chain blocks function to generate check symbols during an encoding mode. The two or more adder chain blocks can have the same adder chain design or different designs. According to some embodiments of the present invention, two or more adder chain blocks are operated in parallel to form a combined encoder/syndrome generator. Each adder chain block generates separate outputs in parallel. The outputs of all but the first adder chain block are dependent on outputs of one or more previous adder chain blocks. Two specific examples of adder chains that can implement a combined encoder/syndrome generator of the present invention are illustrated in FIGS. 2A-2B.

Figure 2A:
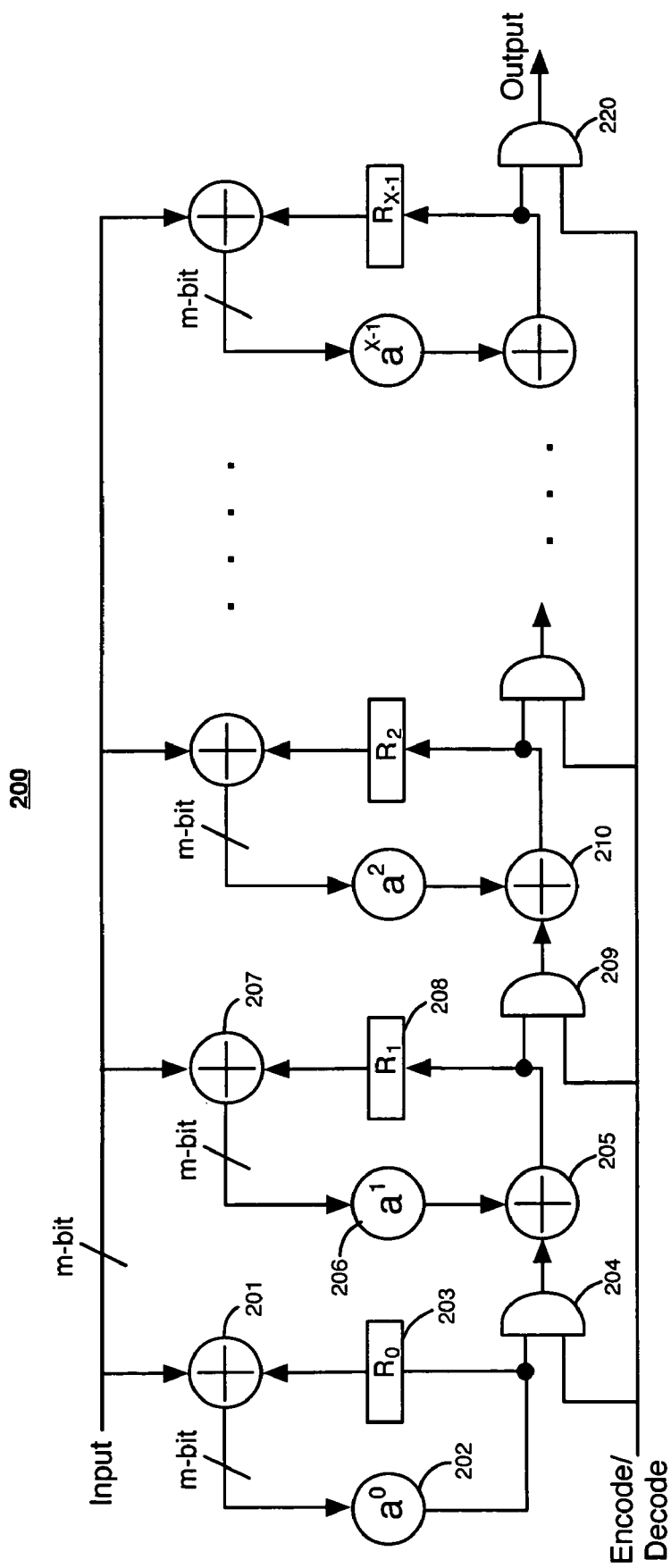
FIG. 2A is a diagram of a Type I combined encoder/syndrome generator block, according to an embodiment of the present invention.
Figure 2B:
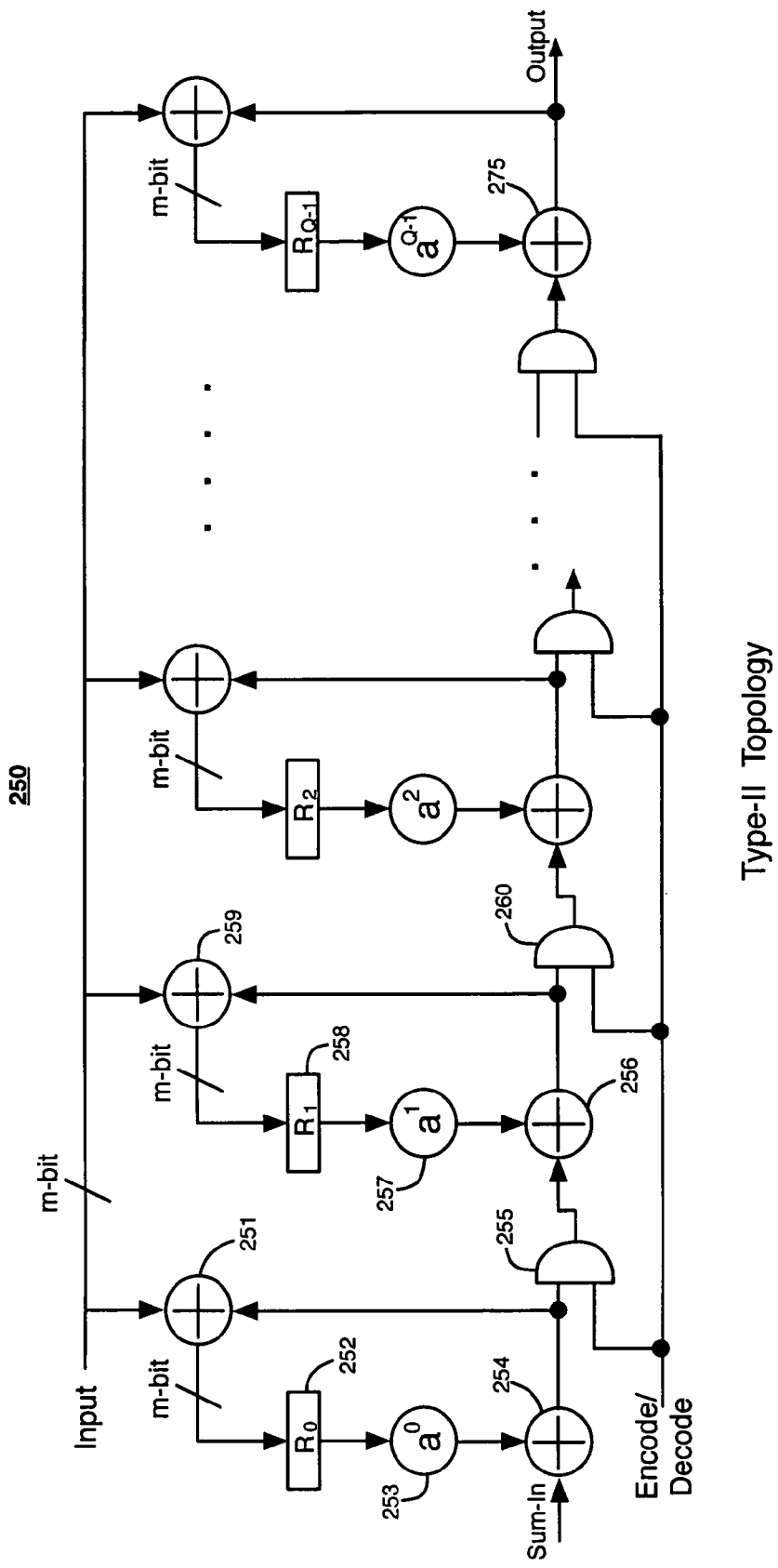
FIG. 2B is a diagram of a Type II combined encoder/syndrome generator block, according to an embodiment of the present invention.

FIG. 2A illustrates an adder chain 200 for a combined encoder/syndrome generator, according an embodiment of the present invention. The adder chain block 200 is referred to as a Type I topology. Adder chain 200 includes X number of stages (also referred to as adder stages), where X is any appropriate number. Each stage of adder chain 200 includes a first adder, a multiplier, a register, and an AND gate. Each stage of adder chain 200 also includes a second adder, except the first stage. The first stage of adder chain 200 includes adder 201, multiplier 202, register 203, and AND gate 204. The second stage of adder chain 200 includes adder 207, multiplier 206, adder 205, register 208, and AND gate 209.

The operation adder chain 200 during an encoding process is now described in detail. During an encoding process, the encode/decode signal is a logic high, allowing AND gates 204, 209, etc. to pass the result of each stage of adder chain 200 on to the next stage. Adder chain 200 receives m-bit input sequences at the Input shown in FIG. 2A.

Adder chain 200 receives the m-bit input sequence at the inputs of the first set of X adders, including adders 201 and 207, and generates m-bit output symbols at the output of AND gate 220. Adder 201 adds the first input sequence $i_0$ to the contents of register 203 (which is initially zero) to generate an output. Multiplier 202 multiplies the output of adder 201 to a coefficient $a^0$. The result of this multiplication is stored in register 203 and transmitted to the output of AND gate 204. Each of these computations is completed in the first time cycle $t_0$.

Similarly, adder 207 adds the first input sequence $i_0$ to the contents of register 208 (which is initially zero). Multiplier 206 then multiplies the result of this addition to a coefficient $a_1$. Adder 205 adds the result of this multiplication to the output of AND gate 204. The output of adder 205 is then stored in register 208 and transmitted to the output of AND gate 209. This process is repeated for each stage of adder chain 200 during the first time cycle for the first input sequence $i_0$. The output symbols of adder chain 200 are generated at the output of the last AND gate 220 during each time cycle.

During the second time cycle $t_1$, the process repeats again in each stage of adder chain 200. For example, adder 201 adds the updated contents of register 203 to the second input sequence $i_1$, and multiplier 202 multiplies the result of this addition to coefficient $a^0$. The result of this multiplication is stored in register 203 and transmitted to the output of AND gate 204.

Also during the second time cycle $t_1$, adder 207 adds the updated contents of register 208 to the second input sequence $i_1$, and multiplier 206 multiplies the result of this addition to coefficient $a^1$. Adder 205 adds the output of multiplier 206 to the output of AND gate 204 and stores the resulting output in register 208. The output of adder 205 is also transmitted to the output of AND gate 209. This process is repeated for each stage of adder chain 200 during the second time cycle for the second input sequence $i_1$. The process is also repeated for each subsequent time cycle in each stage of adder chain 200 for each new input sequence i. Table 1 shows 3 example intermediate results and example outputs during two time cycles $t_0$ and $t_1$ and a time $t_{0-}$ prior to $t_0$ to further illustrate the operation of adder chain 200. In Table 1, $R_0$-$R_{X-1}$ refer to the contents of the registers in adder chain 200.

TABLE 1

| Time | $t_{0-}$ | $t_0$ | $t_1$ |
|---|---|---|---|
| Input | 0 | $i_0$ | $i_1$ |
| $R_0$ | 0 | $a^0 i_0$ | $\{(a^0 \cdot i_0) + i_1\}a^0$ |
| $R_1$ | 0 | $(a^0 + a^1)i_0$ | $\{(a^0 + a^1)i_0 + i_1\}a^1 + (a^0 i_0 + i_1)\}a^0$ |
| $R_2$ | 0 | $(a^0 + a^1 + a^2)i_0$ | $\{(a^0 + a^1 + a^2)i_0 + i_1\}a^2 + \{(a^0 + a^1)i_0 + i_1\}a^1 + (a^0 i_0 + i_1)\}a^0$ |
| $R_{x-1}$/Output | 0 | $(a^0 + a^1 + a^2 + \ldots + a^{X-1})i_0$ | $\{(a^0 + a^1 + a^2 + \ldots + a^{X-1})i_0 + i_1\}a^{X-1} + \{(a^0 + a^1 + a^2 + \ldots + a^{X-2})i_0 + i_1\}a^{X-2} + \ldots + \{(a^0 + a^1)i_0 + i_1\}a^1 + (a^0 i_0 + i_1)\}a^0$ |

During a decoding process, the encode/decode signal is a logic low, preventing AND gates 204, 209, ..., 220 from passing the result of each stage of adder chain 200 on to the next stage. The output of each stage of adder chain 200 is the output of the multipliers 202, 208, etc. The output of each multiplier is a syndrome value for a corresponding input sequence.

FIG. 2B illustrates an adder chain 250 for a combined encoder/syndrome generator, according an embodiment of the present invention. The adder chain 250 is referred to as a Type II topology. Adder chain 250 includes Q number of stages, where Q is any appropriate number. Each stage of adder chain 250 includes a first adder, a register, a multiplier, and a second adder. Each stage also includes an AND gate, except the last stage. For example, the first stage of adder chain 250 includes adder 251, register 252, multiplier 253, adder 254, and AND gate 255. The second stage of adder chain 250 includes adder 259, register 258, multiplier 257, adder 256, and AND gate 260.

The operation adder chain 250 during an encoding process is now described in detail. During an encoding process, the encoding/decode signal is a logic high, allowing the AND gates 255, 260, ..., etc. to pass the result of each stage of adder chain 250 on to the next stage. Adder chain 250 receives m-bit input sequences at the Input shown in FIG. 2B.

Adder chain 250 receives the m-bit input sequence at the inputs of the first set of adders, including adders 251 and 259, and generates m-bit output symbols at the output of adder 275. Each of the first adders 251, 259, etc. adds the input sequence to the output of one of the second adders 254, 256, etc. as shown in FIG. 2B. Initially, the output of the second adders is zero. Therefore, in the first time cycle $t_0$, the first adder in each stage of adder chain 250 simply stores the first m-bit input sequence in a register. For example, adder 251 stores the first input sequence $i_0$ in register 252, adder 259 stores the first input sequence io in register 258, etc. The multipliers in each stage then multiply the contents of the registers by a predefined coefficient. For example, multiplier 253 multiplies the contents of register 252 to coefficient $a^0$, multiplier 257 multiplies the contents of register 258 to coefficient $a^1$, etc.

Next, the second adder in each stage adds the output of the multipliers to the output of the previous stage. The results of these additions appear at the output of the AND gate in each stage. For example, adder 254 adds the output of multiplier 253 to the Sum-In input (e.g., the output of adder chain 200), and the result of the addition appears at the output of AND gate 255. Adder 256 adds the output of multiplier 257 to the output of AND gate 255, and the result of the addition appears at the output of AND gate 260. Each stage of adder chain 250 performs these calculations using outputs from a previous stage, until the output symbols are generated at the output of adder 275.

The adder chain process then repeats again in each subsequent time cycle for each new input sequence. For example, during the second time cycle $t_1$, each stage of adder chain 250 perform a new set of calculations in response to receiving a second m-bit input sequence $i_1$. Specifically, adder 251 adds the output of adder 254 from cycle $t_0$ to the second input sequence $i_1$, and stores the result in register 252, adder 259 adds the output of adder 256 from cycle $t_0$ to the second input sequence $i_1$ and stores the result in register 258, etc. Next, multiplier 253 multiplies the contents of register 252 to coefficient $a_0$, multiplier 257 multiplies the contents of register 258 to coefficient $a_1$, etc. Then, adder 254 adds the output of multiplier 253 to the output of adder chain 200, and the result of the addition appears at the output of AND gate 255. Adder 256 adds the output of multiplier 257 to the output of AND gate 255, and the result of the addition appears at the output of AND gate 260.

This process repeats in each of the adder stages until a new set of output symbols is generated at the output of adder 275. As stated above, the process repeats in each subsequent time cycle in each stage of adder chain 200 for each new input sequence i. Table 2 shows 3 example intermediate results and example outputs during three time cycles $t_0$, $t_1$, $t_2$ and a time $t_{0-}$ prior to $t_0$ to further illustrate the operation of adder chain 250. In Table 2, $R_0$-$R_2$ refer to the contents of the first 3 registers in adder chain 250, and $S_0$ and $S_1$ refer to the m-bit Sum-In inputs at times $t_0$ and $t_1$, respectively.

TABLE 2

| Time | $t_{0-}$ | $t_0$ | $t_1$ | $t_2$ |
|---|---|---|---|---|
| Input | 0 | $i_0$ | $i_1$ | $i_2$ |
| $R_0$ | 0 | $i_0$ | $a^0 i_0 + i_1 + S_0$ | $(a^0 i_0 + i_1 + S_0)a_0 + i_2 + S_1$ |
| $R_1$ | 0 | $i_0$ | $(a^0 + a^1)i_0 + i_1 + S_0$ | $\{(a^0 + a^1)i_0 + i_1 + S_0\}a_1 + (a^0 i_0 + i_1 + S_0)a^0 + i_2 + S_1$ |
| $R_2$ | 0 | $i_0$ | $(a^0 + a^1 + a^2)i_0 + i_1 + S_0$ | $\{(a^0 + a^1 + a^2)i_0 + i_1 + S_0\}a^2 + \{(a^0 + a^1)i_0 + i_1 + S_0\}a^1 + (a^0 i_0 + i_1 + S_0)a^0 + i_2 + S_1$ |
| Output | 0 | 0 | $(a^0 + a^1 + a^2 + \ldots + a^{Q-1})$ | $\{(a^0 + a^1 + a^2 + \ldots + a^{Q-1})i_0 +$ |

TABLE 2-continued

| Time | $t_{0-}$ | $t_0$ $t_1$ | $t_2$ |
|------|----------|-------------|-------|
|      |          | $i_0 + i_1 + S_0$ | $i_1 + S_0]a^{Q-1} + \ldots + (a^0 i_0 + i_1 + S_0)a^0 + i_2 + S_1$ |

During a decoding process, the encode/decode signal is a logic low, preventing AND gates 255, 260, etc. from passing the result of each stage of adder chain 250 on to the next stage. The output of each stage of adder chain 250 is the output of the second adder 254, 256, etc. in each stage. Thus, the output of the second adder 254, 256, etc. in each stage is a syndrome value for a corresponding input sequence.

Figure 3A:
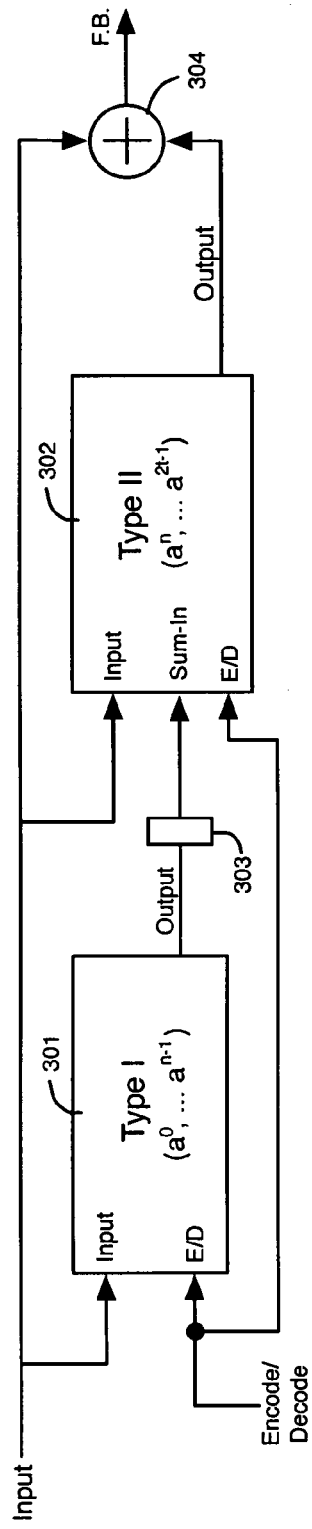
FIG. 3A is a block diagram of a combined encoder/syndrome generator having one Type I block and one Type II block, according to an embodiment of the present invention.

FIG. 3A is a block diagram of a combined encoder/syndrome generator having one Type I adder chain 301 and one Type II adder chain 302, according to an embodiment of the present invention. Adder chain 200 in FIG. 2A is an example of adder chain 301, and adder chain 250 in FIG. 2B is an example of adder chain 302.

The multipliers in adder chain 301 multiply their inputs by coefficients $a^0$-$a^{n-1}$, and the multipliers in adder chain 302 multiply their inputs by coefficients $a^n$-$a^{2t-1}$, where t=the number of error corrected, and n=the number of adder chain blocks. During the encoding mode of the combined encoder/syndrome generator, the output symbols of adder chain 301 (e.g., generated at the output of gate 220) are latched in register 303. The contents of register 303 are loaded into the Sum-In input of adder chain 302 (e.g., at the input of adder 254). The output symbols of adder chain 302 (e.g., generated at the output of adder 275) are transmitted to an input of adder 304. Adder 304 adds the output symbols of adder chain 302 to the input sequences to generate the check symbols at a feedback (F.B.) output.

In the encoding mode, the adder chains in a combined encoder/syndrome generator of the present invention function in parallel to provide a reduced delay computation for the check symbols. For example, at time $t_0$, adder chain 301 computes a first output $S_0$ shown in the third column, last row of Table 1. The output $S_0$ of adder chain 301 is stored in register 303 and becomes an input at Sum-In to adder chain 302 at time $t_1$. Register 303 typically contains enough latches to store all of the symbols that are output in parallel by adder chain 301.

At time $t_1$, adder chain 301 computes a second output $S_1$ shown in the fourth column, last row of Table 1. Also at time $t_1$, adder chain 302 computes an output (shown in the fourth column, last row of Table 2) that is dependent on the value of $S_0$ computed by adder chain 301 in the previous cycle. At time $t_2$, adder chain 302 computes a third output (shown in the fifth column, last row of Table 2) that is dependent on the previous two outputs $S_0$ and $S_1$ of adder chain 301.

Adder chains 301 and 302 function in parallel to provide an encoding system that has a reduced delay. Adder chain 301 computes partial sums $S_0$, $S_1$, . . . which are used as inputs to adder chain 302 in subsequent time cycles to compute the remaining sequence of output symbols for each input sequence.

Figure 3B:
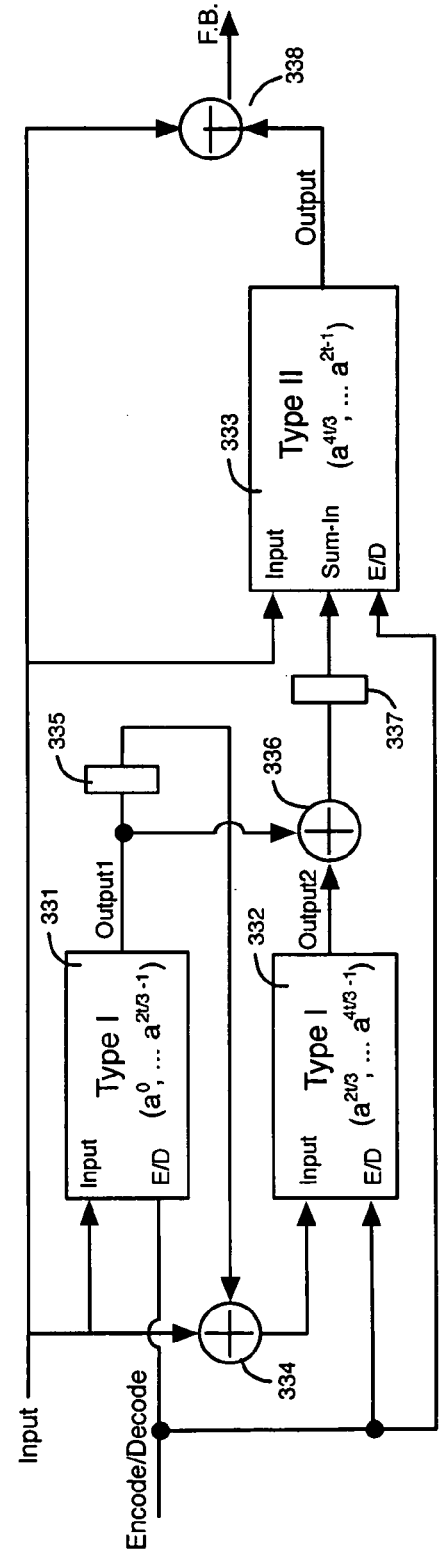
FIG. 3B is a block diagram of a combined encoder/syndrome generator having two Type I blocks and one Type II block, according to another embodiment of the present invention.

FIG. 3B is a block diagram of a combined encoder/syndrome generator having two Type I adder chains 331-332 and one Type II adder chain 333, according to another embodiment of the present invention. Each of adder chains 331-333 operates in parallel. Adder chain 200 in FIG. 2A is an example of adder chains 331-332, and adder chain 250 in FIG. 2B is an example of adder chain 333.

For a given set of m-bit input sequences, the encoder/syndrome generator of FIG. 3B may contain the same number of stages as the FIG. 3A embodiment, but divided up into three adder chains 331-333. For example, if the system of FIG. 3A has 24 stages with 12 stages in each adder chain 301-302, the encoder of FIG. 3B can have 8 stages in each adder chain 331-333, for a total of 24 stages. In encoder of FIG. 3B, the multipliers in adder chain 331 multiply their inputs by coefficients $a_0$-$a^{2t/3}$, the multipliers in adder chain 332 multiply their inputs by coefficients $a^{2t/3}$-$a^{4t/3-1}$, and multipliers in adder chain 333 multiply their inputs by coefficients $a^{4t/3}$-$a^{2t-1}$.

During the encoding mode of the combined encoder/syndrome generator, the output of adder chain 331 is latched in register 335 in each time cycle. After a particular set of output symbols from adder chain 331 are stored in register 335, these output symbols are transmitted from register 335 to inputs of adder 334 in the next time cycle. Adder 334 adds the output symbols from register 335 to the current input sequence at Input to generate a new input sequence for adder chain 332. Adder 336 adds the output of adder chain 332 to the current output of adder chain 331 and stores the result in register 337. The contents of register 337 are transmitted to the input of adder chain 333 in the next time cycle.

The output of adder chain 333 is transmitted to an input of adder 338. Adder 338 adds the output of adder chain 333 to the current input sequence to generate the check symbols at a feedback (F.B.) output. Registers 335 and 337 contain enough latches to store the symbols output in parallel by adder chain 331 and adder 336, respectively. Adders 334, 336, and 338 can contain parallel XOR gates for performing additions on each set of input symbols. Appendix 1 below provides the output symbols for the three adder chains 331-333 at three time intervals $t_0$, $t_1$, and $t_2$.

Figure 4:
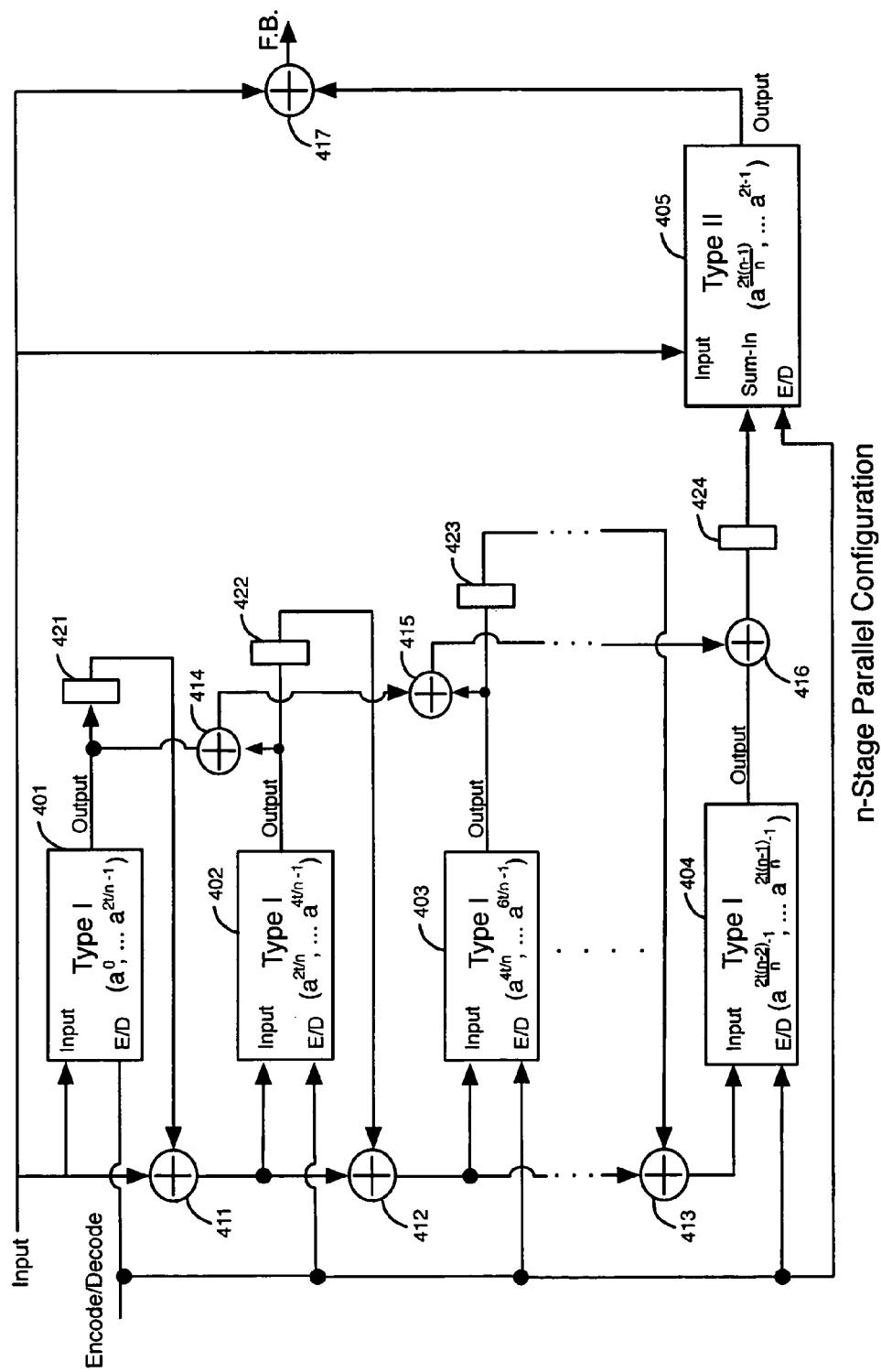
FIG. 4 is a block diagram of a combined encoder/syndrome generator having n−1 Type I blocks and one Type II block, according to yet another embodiment of the present invention.

FIG. 4 is a block diagram of a combined encoder/syndrome generator having n-1 Type I adder chains (such as adder chains 401-404) and one Type II adder chain 405, for a total of n adder chains, according to yet another embodiment of the present invention. Each of the n adder chains, including chains 401-405, operates in parallel. Adder chain 200 in FIG. 2A is an example of the Type I adder chains, including chains 401-404, and adder chain 250 in FIG. 2B is an example of Type II adder chain 405.

For a given set of m-bit input sequences, the encoder/syndrome generator of FIG. 4 may contain the same number of stages as the FIG. 3A and 3B embodiments, but divided up into n adder chains. For example, if the encoder of FIG. 3A has 24 stages with 12 stages in each adder chain 301-302, the encoder of FIG. 4 can have 5 Type I adder chains and one Type II adder chain, with each of the adder chains having 4 stages. In encoder of FIG. 4, the multipliers in adder chain 401 multiply their inputs by coefficients $a^0$-$a^{2t/n-1}$, the multipliers in adder chain 402 multiply their inputs by coefficients $a^{2t/n}$-$a^{4t/n-1}$, and multipliers in adder chain 403 multiply their inputs by coefficients $a^{4t/n}$-$a^{6t/n-1}$, the multipliers in adder chain 404 multiply their inputs by coefficients $a^{2t(n-2)/n-1}$-$a^{2t(n-1)/1-1}$, and the multipliers in adder chain 405 multiply their inputs by coefficients $a^{2t(n-1)/n}$-$a^{2t-1}$.

During the encoding mode of the combined encoder/syndrome generator, each of adder chain blocks 401-405 operate in parallel. In each time cycle, the output of adder chain 401 is stored in register 421, the output of adder chain 402 is stored in register 422, the output of adder chain 403 is stored in register 423, and the output of adder 416 is stored in register 424. Registers 421-424, etc. each contain a set of latches for storing the symbols output in parallel by the Type I adder chains and adder 416. Symbols stored in registers 421-424, etc. during one time cycle are released from the registers in the next time cycle, so that the adder chains can operate in parallel.

Adder 411 adds the contents of register 421 and the current input sequence together to generate an input sequence for adder chain 402. Adder 412 adds the contents of register 422 to the output of adder 411 to generate an input sequence for adder chain 403. Adder 413 generates an input sequence for adder chain 404 in the same manner as adders 411 and 412.

Adders 414-416 sum the outputs of each of the (n−1) Type I adder chains 401-404, etc. in each time cycle and latch the result in register 424. The contents of register 424 are transmitted to the Sum-In input of Type II adder chain 405 in the next time cycle. The output of adder chain 405 is transmitted to an input of adder 417. Adder 417 adds the output of adder chain 405 to the current input sequence to generate the check symbols at a feedback (F.B.) output. Adders 411-416 may contain a set of parallel XOR gates to perform the additions.

The latency for the combined encoder/syndrome generators of FIGS. 3A, 3B, and 4 will now be discussed. $T_{AND}$ represents the delay of the 2-input AND gates of FIGS. 2A-2B. $T_{XOR}$ represents the delay of 2-input XOR gates that can implement the adders of FIGS. 2A-2B. $T_{AVGPi}$ represents the average delay of the fixed Galois Field multipliers of FIGS. 2A-2B. $T_{FF}$ represents the feed-forward computation delay during the encoding mode for the combined encoder/syndrome generators. $T_{FF}$ can be computed using equation (1), where n is the number of adder chains.

$$T_{FF} = T_{avgPi} + (n-1)T_{AND} + nT_{XOR} \quad (1)$$

A combined encoder/syndrome generator of the present invention can have any number n of adder chains, as illustrated in FIG. 4. According to some embodiments of the present invention, the number n of adder chains can be increased without changing the total number of adder stages in the combined encoder/syndrome generator. However, the number of adder stages in each Type I and Type II adder chain can be reduced by a factor of (n+1). Thus, the total number of adder stages divided by (n+1) can equal the number of adder stages in each adder chain.

Alternatively, the adder chain blocks in a combined encoder/syndrome generator do not need to have the same number of adder stages. Using the embodiment of FIG. 3B as an example, adder chain 331 can have 9 adder stages, adder chain 332 can have 8 adder stages, and adder chain 333 can have 7 adder stages, for a total of 24 adder stages.

The ideal number of adder stages is selected for the Type I and Type II adder chains to achieve the best performance. The overall performance of a combined encoder/syndrome generator is reduced by a factor of (n+1). However, as the number of adder chains n is increased in a combined encoder/syndrome generator, the number of registers and adders between the adder chains also increases, which increases the hardware overhead, as shown below in Table 3.

In Table 3, n represents the number of adder chains, and K gates refers to the number of gates in each adder stage. Also in Table 3, the latches(symbols) refer to the number of latches in registers 421-424, etc. that latch the outputs of the Type I adder chains. The outputs of each Type I adder chain are stored by enough latches to store each output symbol. The number of these latches equals the number of Type I adder chains times the number of output symbols. Also in Table 3, the XOR gates(symbols) refer to the number of XOR gates that are needed to implement adders 411-416, etc. in the combined encoder/syndrome generator.

TABLE 3

| Number of Adder Chain Blocks | Maximum Performance | Minimum Hardware |
|---|---|---|
| Original Circuit | t cycles | K gates |
| 1 | t/2 cycles | K gates + 1 latches (symbols) |
| 2 | t/3 cycles | K gates + 2 latches (symbols) + 2 XOR gates (symbols) |
| n | t/(n + 1) cycles | K gates + (n − 1) latches (symbols) + 2(n − 1) XOR gates (symbols) |

Figure 5:
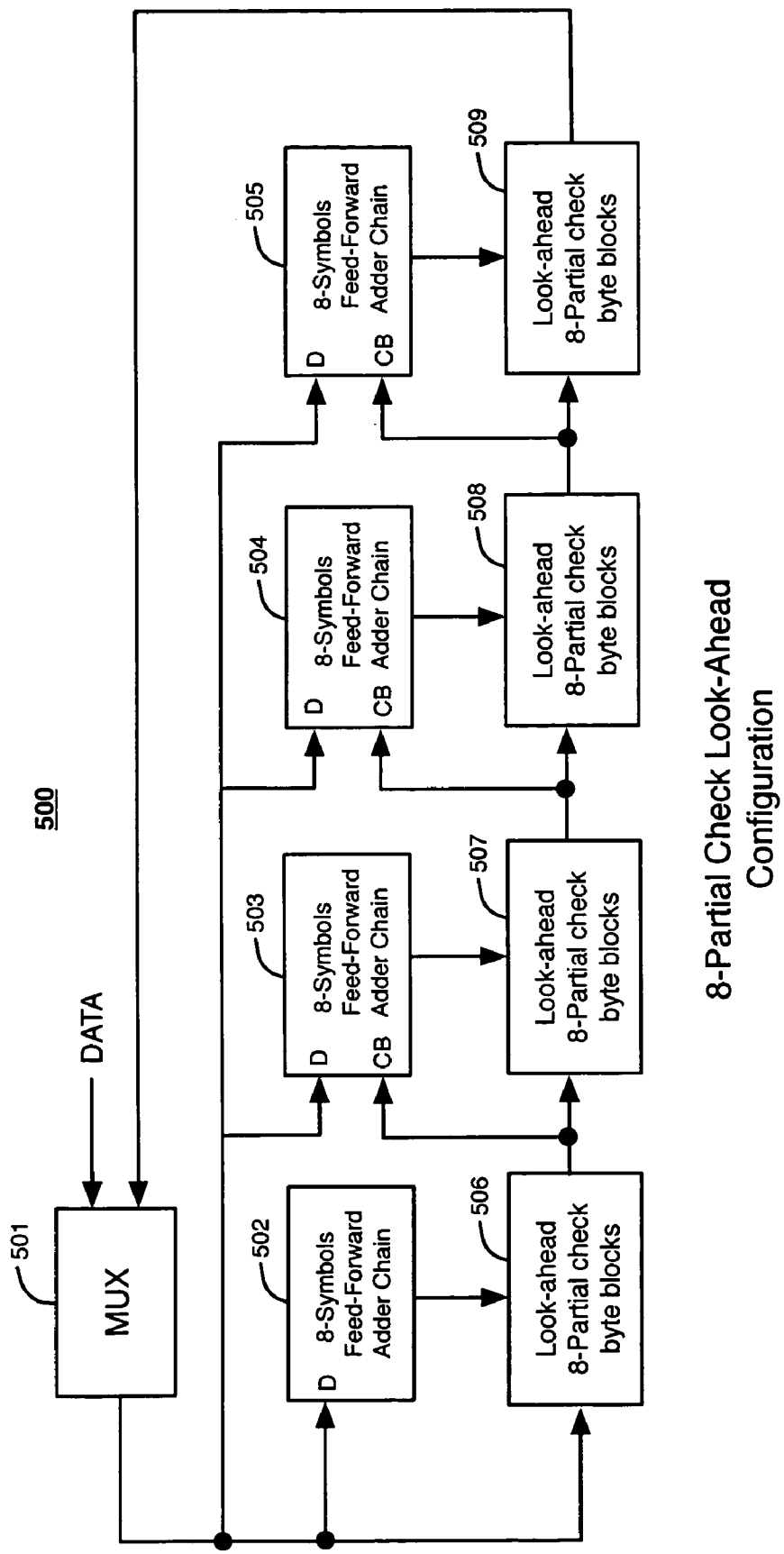
FIG. 5 is a block diagram of a combined encoder/syndrome generator having look-ahead blocks that compute 8-partial check bytes, according to an embodiment of the present invention.

FIG. 5 is a block diagram of a combined encoder/syndrome generator 500 having look-ahead blocks that compute 8-partial check bytes, according to another embodiment of the present invention. Combined encoder/syndrome generator 500 includes a multiplexer 501, four 8-symbol feed-forward adder chains 502-505, and four look-ahead 8-partial check byte blocks 506-509. Adder chains 200 and 250 in FIGS. 2A-2B are examples of adder chains 502-505.

Combined encoder/syndrome generator 500 generates check symbols during an encoding mode with less latency than the previous embodiments. Each of adder chains 502-505 receives the output of multiplexer 501 at a D Input. Adder chains 503-505 also receive the outputs of look-ahead partial check byte blocks 506-508, respectively, at a CB input.

Look-ahead blocks 506-509 generate partial check bytes using intermediate results from adder chains 502-505. The partial check bytes generated by look-ahead blocks 506-508 are provided to the CB inputs of adder chains 503-505, respectively. Look-ahead blocks 506-509 can generate intermediate results for the check symbol computations with less latency than an encoder that generates check symbols using only adder stages coupled in series.

Look-ahead block 509 generates the output check symbols for system 500. Alternatively, the output of look-ahead block 509 can be fed back into an input of multiplexer 501. Multiplexer 501 can route input data or the output of block 509 to inputs of adder chains 502-505 and block 506. Once the sector data is read, multiplexer 501 closes the feedback loop by coupling the output of block 509 to the inputs of blocks 502-506 for 2t clock cycles. After the 2t clock cycles, the check bytes are ready to be written, e.g., to a data storage disk.

Figure 6:
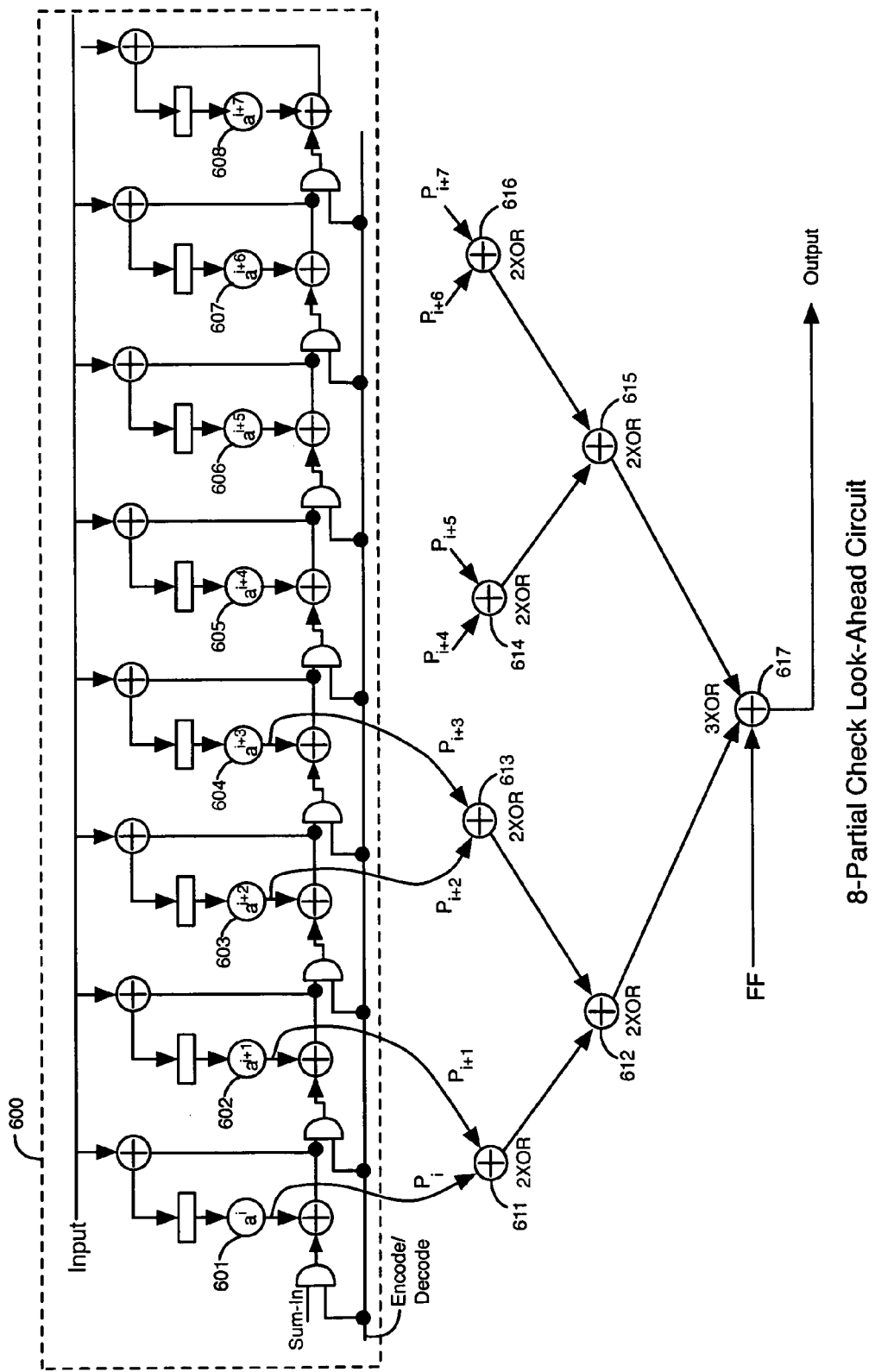
FIG. 6 is a partial diagram of a combined encoder/syndrome generator illustrating more detail of an adder chain and a look-ahead block, according to an embodiment of the present invention.

FIG. 6 illustrates a more detailed diagram of one of the 8-symbol feed-forward adder chains and one of the corresponding look-ahead 8-partial check byte blocks of FIG. 5, according to a specific embodiment of the present invention. Feed-forward adder chain 600 is a specific example of one of feed-forward adder chains 502-505. Adder chain 600 is identical to adder chain 250 shown in FIG. 2B. The Sum-In input can be used as the CB input in blocks 503-505, and Input can be used as the D input in blocks 502-505. It should be understood that other adder chains can also be used to perform the functions of blocks 502-505.

XOR gates 611-617 comprise an 8-byte partial check byte look-ahead block that is a specific example of one of look-ahead 8-partial check byte blocks 506-509. 2 XOR gates 611 sum the outputs $P_i$ of multiplier 601 with the outputs $P_{i+1}$ of multiplier 602. 2 XOR gates 613 sum the outputs $P_{i+2}$ of multiplier 603 with the outputs $P_{i+3}$ of multiplier 604. 2 XOR gates 614 sum the outputs $P_{i+4}$ of multiplier 605 with the outputs $P_{i+5}$ of multiplier 606. 2 XOR gates 616 sum the outputs $P_{i+6}$ of multiplier 607 with the outputs $P_{i+7}$ of multiplier 608. 2 XOR gates 612 sum the outputs of XOR gates 611 and 613. 2 XOR gates 615 sum the outputs of XOR gates 614 and 616. 3 XOR gates 617 sum the outputs of XOR gates 612, XOR gates 615, and a feed-forward (FF) input to generate partial check byte outputs. The feed-forward inputs for look-ahead blocks 507-509 are the outputs from the previous look-ahead blocks 506-508. The feed-forward input for look-ahead block 506 is the output of multiplexer 501.

Thus, a look-ahead partial check byte block with XOR gates 611-617 form a three stage tree structure. The first stage of the tree includes XOR gates 611, 613, 614 and 616. The second stage of the tree includes XOR gates 612 and 615. The third stage of the tree includes XOR gates 617. The XOR gates in a each stage perform the computations in parallel with the other XOR gates in that stage. Therefore, the latency of a look-ahead partial check byte block containing XOR gates 611-617 is three times the delay of an XOR gate, because the XOR gates are organized into the three stage tree structure.

Other the other hand, the full latency of 8-symbol feed-forward adder chain 600 is at least 8 times the delay of an XOR gate, because adder chain 600 has 8 adders coupled in series between the AND gates. As a result, look-ahead partial check byte blocks 506-509 have a significantly reduced latency relative to the adder chains. Thus, combined encoder/syndrome generator 500 can generate check symbols in less time, because the look-ahead partial check byte blocks are able to compute partial results and transmit the partial results to the next adder chain (and multiplexer 501) before the adder chains can complete the computations.

FIGS. 7A-7B illustrate how the outputs of look-ahead partial check byte blocks can be added together to become larger look-ahead partial check byte blocks, according to further embodiments of the present invention. FIG. 7A shows that the outputs of two look-ahead 8-partial check byte blocks 701 and 702 and an input sequence IN can be added together by adder 703 to generate a 16 partial check bytes. The 16 partial check bytes can be used as CB inputs to subsequent adder chains and as input to look-ahead partial check byte blocks.

FIG. 7B shows that the outputs of two look-ahead blocks 711 and 712 that generate 16-partial check bytes (e.g., as shown in FIG. 7A) can be added together with an input sequence IN by adder 713 to generate 32 partial check bytes. The 32 partial check bytes can be used as CB inputs to subsequent adder chains and as inputs to look-ahead partial check byte blocks.

Figure 8A:
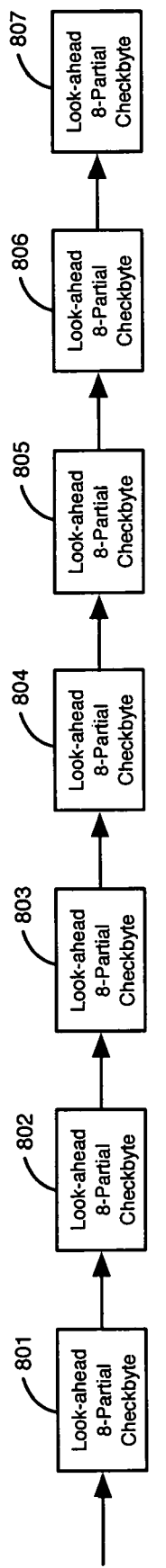
FIG. 8A is a block diagram that illustrates a serial cascade of 8-partial check byte look-ahead blocks, according to yet another embodiment of the present invention.
Figure 8B:
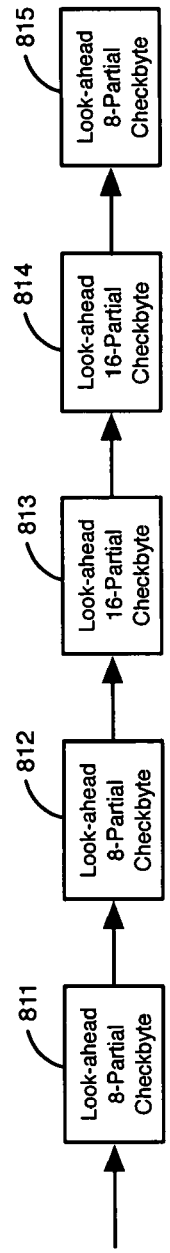
FIG. 8B is a block diagram that illustrates a serial cascade of 8-partial check byte and 16-partial check byte look-ahead blocks, according to still another embodiment of the present invention.

FIGS. 8A-8B illustrate how look-ahead partial check byte blocks of different sizes can be coupled together in series, according to additional embodiments of the present invention. In FIG. 8A, 7 look-ahead 8-partial check byte blocks 801-807 are coupled together in series to generate the check symbols. Each block 801-807 is coupled to an adder chain (not shown) to receive partial results, as discussed above, for example, with respect to FIG. 5.

In FIG. 8B, 5 look-ahead partial check bytes blocks are coupled together in series to generate the check symbols. Blocks 811, 812, and 815 generate 8-partial check bytes, and blocks 813 and 814 generate 16-partial check bytes. The system of FIG. 8B can generate the same output check symbols as the system of FIG. 8A, because blocks 813 and 814 generate the same outputs as two 8-partial check byte look-ahead.

If blocks 813 and 814 can comprise two 8-partial check byte look-ahead blocks that operate in parallel, as shown in FIG. 7A, the embodiment of FIG. 8B can generate output check symbols with less latency than the embodiment of FIG. 8A. The reduced latency is a result of the smaller 8-partial check byte blocks within computational blocks 813 and 814 operating in parallel. The arrival time to the last block is 6T in FIG. 8A and 4T in FIG. 8B, where T is the delay of each partial check byte look-ahead block. The delay of the look-ahead partial check byte embodiments equals $2 \log_2(2-n) \cdot T_{XOR}$, where $T_{XOR}$ is the delay of the XOR gates.

All of the embodiments of the present invention discussed herein and shown in the Figures are preferably implemented in hardware (e.g., hardwired circuitry) to provide maximum efficiency and throughput. However, any of the embodiments of the present invention can also be implemented in partially or totally in software. A combined encoder syndrome generator of the present invention can be in many applications. For example, the present invention can be employed in a hard disk drive, e.g., as part of a hard disk drive controller chipset. The present invention can also be used for chip memory or storage (i.e., in DRAM, flash, etc.).

The foregoing description of the exemplary embodiments of the invention has been presented for the purposes of illustration and description. It is not intended to be exhaustive or to limit the invention to the precise form disclosed. A latitude of modification, various changes, and substitutions are intended in the present invention. In some instances, features of the invention can be employed without a corresponding use of other features as set forth. Many modifications and variations are possible in light of the above teachings, without departing from the scope of the invention. It is intended that the scope of the invention be limited not with this detailed description, but rather by the claims appended hereto.

APPENDIX 1

| Time | | $t_{0-}$ | $t_0$ | $t_1$ | $t_2$ |
|---|---|---|---|---|---|
| First Adder Chain | Input Output | 0 0 | $i_0$ $\sum_{k=0}^{1} a^k \cdot i_0$ | $i_1$ $\left(\sum_{k=0}^{1} a^k \cdot i_0 + i_1\right)a^1 + (a^0 i_0 + i_1)a^0$ | $i_2$ $\left\{\left(\sum_{k=0}^{1} a^k \cdot i_0 + i_1\right)a^1 + (a^0 i_0 + i_1)a^0 + i_2\right\}a^1 +$ $\{(a^0 \cdot i_0 + i_1)a^0 + i_2\}a^0$ |
| Second Adder Chain | Input | 0 | $i_0$ | $\sum_{k=0}^{1} a^k \cdot i_0 + i_1$ | $\left(\sum_{k=0}^{1} a^k \cdot i_0 + i_1\right)a^1 + (a^0 i_0 + i_1)a^0 + i_2$ |

APPENDIX 1-continued

| Time | | $t_{0-}$ | $t_0$ | $t_1$ | $t_2$ |
|---|---|---|---|---|---|
| | Output | 0 | $\sum_{k=2}^{3} a^k \cdot i_0$ | $\left(\sum_{k=0}^{3} a^k \cdot i_0 + i_1\right)a^3 + \left(\sum_{k=0}^{2} a^k \cdot i_0 + i_1\right)a^2$ | $\left(\sum_{k=0}^{3} a^k \cdot i_0 + i_1\right)a^3 + \left(\sum_{k=0}^{2} a^k \cdot i_0 + i_1\right)a^2 +$ $\left(\sum_{k=0}^{1} a^k \cdot i_0 + i_1\right)a^1 + (a^0 i_0 + i_1)a^0 + i_2\} +$ $\left(\sum_{k=0}^{2} a^k \cdot i_0 + i_1\right)a^2 + \left(\sum_{k=0}^{1} a^k \cdot i_0 + i_1\right)a^1 + (a^0 i_0 + i_1)a^0 + i_2\}a^2$ |
| Last Adder Chain | Input | 0 | $i_0$ | $i_1$ | $i_2$ |
| | Output | 0 | $i_0$ | $\sum_{k=0}^{3} a^k \cdot i_0$ | $\left(\sum_{k=0}^{3} a^k \cdot i_0 + i_1\right)a^3 + \left(\sum_{k=0}^{2} a^k \cdot i_0 + i_1\right)a^2 + \left(\sum_{k=0}^{1} a^k \cdot i_0 + i_1\right)a^1 + (a^0 i_0 + i_1)a^0 + i_2$ |
| | F.B. | 0 | $i_0$ | $\sum_{k=0}^{5} a^k \cdot i_0 + i_1$ | $\left(\sum_{k=0}^{5} a^k \cdot i_0 + i_1\right)a^5 + \left(\sum_{k=0}^{4} a^k \cdot i_0 + i_1\right)a^4 + \left(\sum_{k=0}^{3} a^k \cdot i_0 + i_1\right)a^3 +$ $\left(\sum_{k=0}^{2} a^k \cdot i_0 + i_1\right)a^2 + \left(\sum_{k=0}^{1} a^k \cdot i_0 + i_1\right)a^1 + (a^0 i_0 + i_1)a^0 + i_2$ |

The invention claimed is:

1. A combined encoder/syndrome generator circuit comprising:
   a first adder chain circuit block coupled to receive an input sequence, the first adder chain circuit block comprising first adder stages that generate syndromes during a decoding mode;
   a second adder chain circuit block coupled to receive the input sequence, the second adder chain circuit block comprising second adder stages that generate syndromes during the decoding mode,
   wherein the first and the second adder chain circuit blocks generate separate outputs in parallel that are used to generate check symbols during an encoding mode, and a current output of the second adder chain circuit block is dependent on a previous output of the first adder chain circuit block; and
   a first adder coupled to the outputs of the first and the second adder chain circuit blocks, wherein the first adder adds the generated syndromes from the first and the second adder stages.

2. The combined encoder/syndrome generator circuit defined in claim 1 further comprising:
   a first register for storing outputs of the first adder chain circuit block;
   a second adder that adds contents of the first register and the input sequence; and
   a third adder chain circuit block coupled to receive an output of the second adder, the third adder chain circuit block comprising third adder stages that generate syndromes during the decoding mode, wherein the first, the second, and the third adder chain circuit blocks generate separate outputs in parallel during the encoding mode.

3. The combined encoder/syndrome generator defined in claim 2 further comprising:
   a second register for storing outputs of the third adder chain circuit block;
   a third adder that adds contents of the second register and the output of the second adder; and
   a fourth adder chain circuit block coupled to receive an output of the third adder, the fourth adder chain circuit block comprising fourth adder stages that generate syndromes during the decoding mode, wherein the first, the second, the third, and the fourth adder chain circuit blocks generate separate outputs in parallel during the encoding mode.

4. The combined encoder/syndrome generator defined in claim 1 further comprising:
   a first look-ahead circuit block coupled to receive the input sequence and intermediate values from the first adder chain circuit block, the first look-ahead circuit block generating first partial check bytes,
   wherein the second adder chain circuit block receives the first partial check bytes as inputs.

5. The combined encoder/syndrome generator defined in claim 4 further comprising:
   a second look-ahead circuit block coupled to receive the first partial check bytes and intermediate values from the second adder chain circuit block, the second look-ahead block generating second partial check bytes; and
   a third adder chain circuit block that receives the second partial check bytes as inputs.

6. The combined encoder/syndrome generator defined in claim 1 further comprising:
   a look-ahead circuit block coupled to receive intermediate values from the second adder chain circuit block, the look-ahead block generating 16 partial check bytes.

7. The combined encoder/syndrome generator defined in claim 1 further comprising:
   a plurality of look-ahead blocks that are coupled to receive intermediate values from an adder chain circuit block, a first subset of the plurality of look-ahead blocks generating 8-partial check bytes, and a second subset of the plurality of look-ahead blocks generating 16-partial check bytes.

8. A combined encoder/syndrome generator circuit comprising:
   a first adder chain circuit block coupled to receive an input sequence, the first adder chain circuit block comprising first adder stages that generate syndromes during a decoding mode;

a second adder chain circuit block coupled to receive the input sequence, the second adder chain circuit block comprising second adder stages that generate syndromes during the decoding mode, wherein the first and the second adder chain circuit blocks generate separate outputs in parallel that are used to generate check symbols during an encoding mode, and a current output of the second adder chain circuit block is dependent on a previous output of the first adder chain circuit block;

a first register for storing outputs of the first adder chain circuit block;

a first adder that adds contents of the first register and the input sequence;

a third adder chain circuit block coupled to receive an output of the first adder, the third adder chain circuit block comprising third adder stages that generate syndromes during the decoding mode, wherein the first, the second, and the third adder chain circuit blocks generate separate outputs in parallel during the encoding mode;

a second register for storing outputs of the third adder chain circuit block;

a second adder that adds contents of the second register and the output of the first adder; and a fourth adder chain circuit block coupled to receive an output of the second adder, the fourth adder chain circuit block comprising fourth adder stages that generate syndromes during the decoding mode, wherein the first, the second, the third, and the fourth adder chain circuit blocks generate separate outputs in parallel during the encoding mode.

* * * * *